United States Patent [19]

Struck

[11] Patent Number: 5,661,679

[45] Date of Patent: Aug. 26, 1997

[54] DELAY CIRCUIT HAVING A PLURALITY OF MEMORY CELLS AND CORRESPONDING CONTROL CIRCUITS FOR CONTROLLING THE MOVEMENT OF A SIGNAL THROUGH THE MEMORY CELLS

[75] Inventor: Sönke Struck, Neu Wulmsdorf, Germany

[73] Assignee: U.S. Philips Corporation, New York, N.Y.

[21] Appl. No.: 595,090

[22] Filed: Feb. 1, 1996

[30] Foreign Application Priority Data

Feb. 4, 1995 [DE] Germany ............... 195 03 782.0

[51] Int. Cl.[6] ............................. G11C 7/00; G11C 11/24
[52] U.S. Cl. .................. 365/149; 365/233; 327/284
[58] Field of Search ............................. 327/261, 264, 327/269, 271, 272, 277, 278, 284, 285; 365/149, 233, 230.03

[56] References Cited

U.S. PATENT DOCUMENTS

| 5,012,143 | 4/1991 | Boudewijns | 307/606 |
|---|---|---|---|
| 5,068,825 | 11/1991 | Mahant-Shetti et al. | 365/154 |
| 5,313,438 | 5/1994 | Hieda et al. | 365/238 |
| 5,493,527 | 2/1996 | Lo et al. | 365/185.11 |
| 5,519,660 | 5/1996 | Iwahashi | 365/203 |
| 5,544,096 | 8/1996 | Takasugi | 365/149 |
| 5,555,215 | 9/1996 | Nakagome et al. | 365/226 |
| 5,566,116 | 10/1996 | Kang | 365/205 |
| 5,574,681 | 11/1996 | Foss et al. | 365/149 |
| 5,574,694 | 11/1996 | Van Der Ropp | 365/203 |

Primary Examiner—Timothy P. Callahan
Assistant Examiner—My-Trang Nu Ton
Attorney, Agent, or Firm—Edward W. Goodman

[57] ABSTRACT

A delay circuit having at least two memory cells (3, 4, 5, 6, 8, 9) each including a capacitive memory element (20, 26, 40, 45), a write transistor (22, 28, 42, 47) by which information to be delayed can be written from a write line (18) into the capacitive memory element (20, 26, 40, 45), and a read transistor (21, 27, 41, 46) by which information can be read from the capacitive memory element (20, 26, 40, 45) on a read line (19), and having a control arrangement which is clocked by means of a first control clock and whose input receives a control signal and which includes intercoupled control circuits (11, 12, 13, 14, 15, 16) one of which is associated with a respective memory cell (3, 4, 5, 6, 8, 9), each control circuit (11, 12, 13, 14, 15, 16) of the read transistor (21, 27, 41, 46) of the associated memory cell (3, 4, 5, 6, 8, 9) being controllable by means of the input signal and each control circuit (11, 12, 13, 14, 15, 16) of the write transistor (22, 28, 42, 47) of the associated memory cell being controllable by means of the output signal, in which each control circuit (11, 12, 13, 14, 15, 16) has a first control element (43, 48, 24, 30) and a subsequent second control element (44, 49, 25, 31), those control circuits (14) whose preceding control circuit (11) is arranged locally remote have a third control element (29) preceding the first control element (30), in that the input of the third control element (29) receives the output signal of the first control element (24) of the preceding, spatially remote control circuit (11), and in that the first control elements (43, 48, 24, 30) of the control circuits (11, 12, 13, 14, 15, 16) are clocked by the first clock and the second (44, 49, 25, 31) and third (29) control elements of the control circuits (11, 12, 13, 14, 15, 16) are clocked by a second clock.

8 Claims, 1 Drawing Sheet

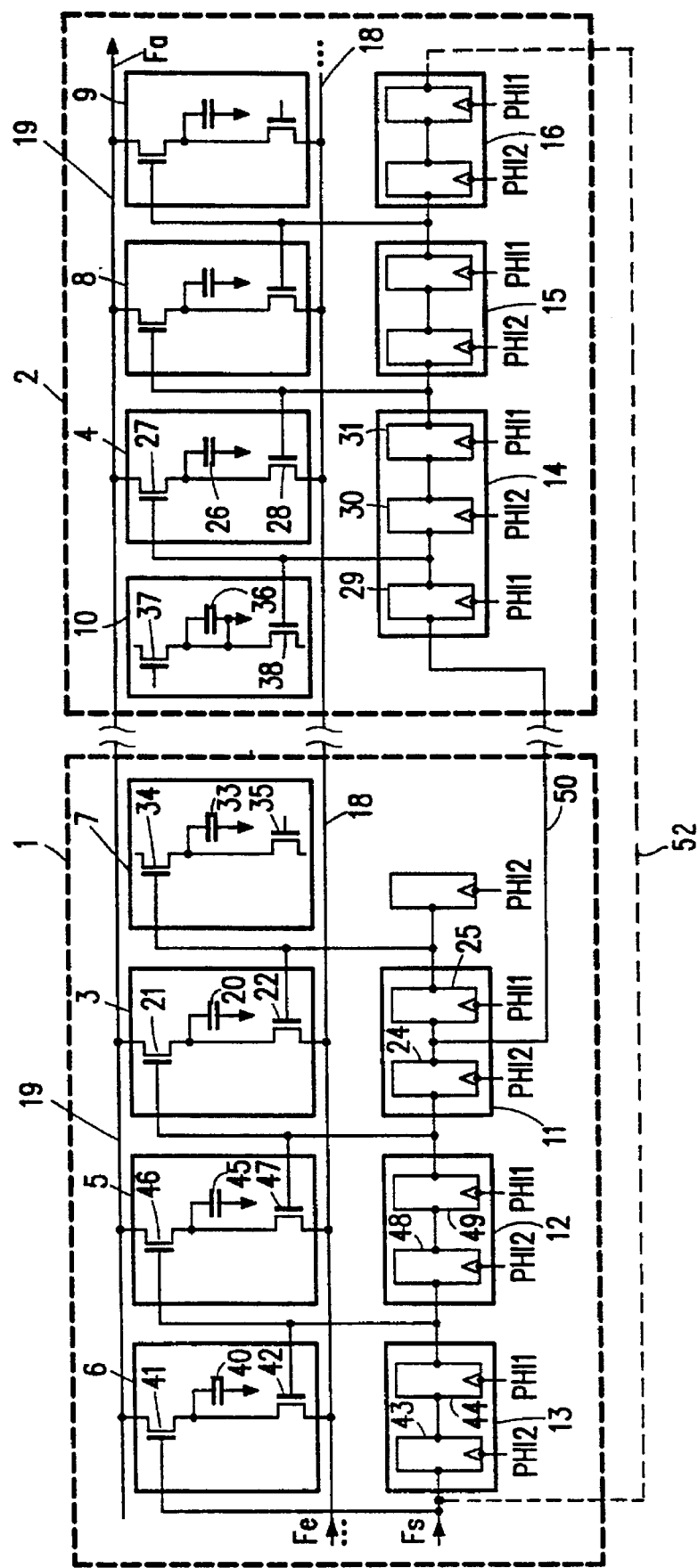

DELAY CIRCUIT HAVING A PLURALITY OF MEMORY CELLS AND CORRESPONDING CONTROL CIRCUITS FOR CONTROLLING THE MOVEMENT OF A SIGNAL THROUGH THE MEMORY CELLS

BACKGROUND OF THE INVENTION

1. Field of the Invention

The invention relates to a delay circuit having at least two memory cells each comprising a capacitive memory element, a write transistor by means of which information to be delay be written from a write line into the capacitive memory element, and a read transistor by means of which information can be read from the capacitive memory element to a read line, and having a control arrangement which is clocked by means of a first control clock and whose input receives a control signal and which comprises intercoupled control circuits one of which is associated with a respective memory cell, each control circuit of the read transistor of the associated memory cell being controllable by means of the input signal and each control circuit of the write transistor of the associated memory cell being controllable by means of the output signal.

2. Description of the Related Art

Delay circuits of this type are known from EP 383 387, corresponding to U.S. Pat. No. 5,012,143. They are widely used in, inter alia, the video technique, for example, for realizing comb filters, for implementing noise reduction algorithms and for color decoding. These delay circuits have the characteristic feature that the output of a control circuit with the first clock simultaneously controls the write transistor of the memory cell associated with the control circuit and the read transistor of the subsequent memory cell. In the design of such delay circuits, particular attention should therefore be paid to the fact that no asymmetries due to different delay times of the control signal occur when the write and read transistors are controlled simultaneously.

In delay circuits which are realized as monolithically integrated circuits, the single memory cells are arranged in the same orientation on the silicon crystal, resulting in long, narrow rows. The number of memory cells which can be arranged on a silicon crystal can be increased by arranging a plurality of rows of memory cells on one silicon crystal. Such an arrangement is shown in FIG. 4 of EP 383 387. However, in this arrangement, the transistor from the last memory cell of a first row to the first memory cell of the subsequent row presents the problem that the delay times of the control signal for controlling the write transistor of the last memory cell of the first row and the read transistor of the first memory cell of the subsequent row are clearly different. This asymmetrical control of the write and read transistors leads to visible picture disturbances in the video technique. The same problem occurs, for example, when realizing a loop, in which the output of the control circuit of the last memory cell of a delay circuit of the type described in the preamble, is coupled to the input of the control arrangement of the delay circuit. The simultaneous control of the write transistor of the last memory cell and the read transistor of the first memory cell has hitherto been impossible.

SUMMARY OF THE INVENTION

It is an object of the invention to provide a possibility of simultaneously controlling locally remote write and read transistors in such a delay circuit without any delay time difference and consequently without any disturbance of the locations where this problem occurs.

According to the invention, this object is solved in that each control circuit has a first control element and a subsequent second control element, in that those control circuits whose preceding control circuit is arranged locally remote have a third control element preceding the first control element, in that the input of the third control element receives the output signal of the first control element of the preceding, spatially remote control circuit, and in that the first control elements of the control circuits are clocked by the first clock and the second and third control elements of the control circuits are clocked by a second clock.

The first clock and the second clock are offset with respect to time and do not coincide. If a second memory cell is arranged subsequent to and locally remote from a first memory cell, the control information, with the first clock present at the input of the control circuit of the first memory cell, is applied to the output of the first memory elements of the first control circuit and, delayed by a delay time, to the input of the locally remote control circuit of the second memory cell. Subsequently, the control information, with the second clock, is simultaneously applied without delay time difference to the output of the control circuit of the first memory cell which controls the write transistor of the first memory cell, and to the output of the third control element of the second memory cell which controls the read transistor of the second memory cell. Consequently, the exactly simultaneous control of the write transistor of the first memory cell and the read transistor of the second, locally remote memory cell is realized. The above-mentioned problem-causing locations can thus be realized free from disturbances.

In accordance with an advantageous embodiment of the invention, the output of the second control element of those control circuits whose subsequent control circuit is arranged spatially remote and the output of the third control element of the subsequent locally remote control circuit are coupled to an additional memory cell which is not provided for delaying the information.

In locally juxtaposed memory cells, each output of the control circuits is coupled to the write transistor of the memory cell associated with the control circuit and to the read transistor of the subsequent memory cell. Consequently, the output load of each control circuit is formed by two memory cells. In order that the output load of the control circuit of a first memory cell and the output load of the third control element of a memory cell arranged subsequent to and locally remote from the first memory cell are identical to the output load of the control circuits of the other, juxtaposed memory cells, the output of the control circuit of the first memory cell and the output of the third control element of the second, locally remote memory cell are coupled to respective, additional memory cells. These additional memory cells are not provided for delaying the information but rather are only employed to supply a symmetrical output load to the output of the control circuit of the first memory cell and to the output of the third control element of the second, locally remote memory cell.

In accordance with a further advantageous embodiment of the invention, a first group of memory cells is arranged in a first area and a second group of memory cells is arranged in a second, locally remote area; and the output signal of the first control element of the control circuit of the last memory cell of the first group represents the input signal of the control circuit of the first memory cell of the second group.

The first group is, for example, a number of memory cells arranged in a row on a silicon crystal, the second group is a further number of memory cells arranged in a row on the same silicon crystal, in which the second group is to be arranged subsequent to the first group. According to the invention, the transition between the last memory cell of the first group and the first memory cell of the second group can be realized with low disturbance.

In accordance with a further advantageous embodiment of the invention, the input of the control arrangement receives the output signal of the control arrangement.

With such a delay circuit, for example, a loop can be realized with low disturbance. Control information then successively traverses the serially arranged control circuits of a number of memory cells, is coupled from the output of the last control circuit to the input of the first control circuit and again traverses the serially arranged control circuits. According to the invention, the first and the last memory cell of this loop are, realized with low disturbance.

Delay circuits according to the invention may advantageously be used for realizing signal processing circuits in video recorders or television receivers. Particularly, noise reduction circuits, circuits for drop-out compensation and chrominance comb filters can be realized in video recorders, and comb filters for signal separation and circuits for colour decoding can be realized in television receivers.

BRIEF DESCRIPTION OF THE DRAWING

These and other aspects of the invention will be apparent from and elucidated with reference to the embodiment described hereinafter with reference to the sole FIGURE, which shows a delay circuit embodying the subject invention.

DESCRIPTION OF THE PREFERRED EMBODIMENT

Delay circuits are used for the purpose of providing an output signal in the form of a signal which has been applied to their input and delayed by a predeterminable time.

These circuits may be realized, for example by means of capacitive memory elements which are successively written by means of sample values of a signal in such a way that write switches are closed for a short time while the sample values represent a video signal amplitude occurring at the instant of closing the relevant write switch. The capacitive memory elements are consecutively read after a predeterminable delay time in that a read switch is closed for a short time. This technique is referred to as the switched-capacitor technique.

Particularly in the video technique, it is important to avoid asymmetries in the control of the switches, because these asymmetries become manifest as picture disturbances.

The sole FIGURE shows a section of a delay circuit which comprises a first group 1 and a second group 2 of memory cells arranged in rows. The memory cells of the groups 1 and 2 are arranged side by side in rows, with a memory cell 4 of the second group 2 being arranged locally remote from a memory cell 3 of the first group 1, i.e., at a considerably larger distance from each other than juxtaposed memory cells of each group. Memory cells are arranged in long, narrow rows on, for example, a silicon crystal, on which several rows are arranged subjacent and superjacent to each other. The first group 1 may be, for example, a first row of memory cells on a silicon crystal, the second group 2 may be a second row of memory cells arranged above or below the first row.

In addition to the memory cell 3, the group 1 also has three memory cells 5, 6 and 7 as well as a number of further memory cells (not shown) represented by dots. The group 2 thus comprises the memory cell 4 and the memory cells 8, 9 and 10, as well as a number of further memory cells (not shown) represented by dots.

Each memory cell, except the memory cells 7 and 10, is associated with a control circuit. In the first group, the memory cells 3, 5 and 6 are associated with the control circuits 11, 12 and 13, and in the second group, the memory cells 4, 8 and 9 are associated with the control circuits 14, 15 and 16. A control circuit is also associated with the memory cells not shown in groups 1 and 2.

An input signal $F_e$ is applied to the memory cells via a write line 18 and the delayed output signal $F_a$ is conveyed via a read line 19. The control circuits of the first group which are not shown as well as the control circuits 13, 12 and 11 of the first group are serially connected together. The control circuits 14, 15 and 16 of the second group and the control circuits of the second group which are not shown are also serially connected together. A control signal $F_s$ is applied to the input of the first control circuit of the first group 1.

The memory cell 3 comprises a storage capacitor 20, a write transistor 22 and a read transistor 21. The control circuit 11 associated with the memory cell 3 comprises two serially connected control elements 24 and 25. The control circuits 12, 13, 15 and 16 as well as the control circuits which are not shown also comprise two control elements each.

The input of the control circuit 11 is coupled to the control electrode of the read transistor 21, one electrode of which is coupled to the read line 19 and the other electrode of which is coupled to an electrode of the storage capacitor 20 and to an electrode of the write transistor 22. The other electrode of the storage capacitor 20 is coupled to the reference potential. The output signal of the control circuit 11 is coupled to the control electrode of the write transistor 22, the other electrode of which is coupled to the write line 18. Moreover, the junction point of the control elements 24 and 25 is coupled to the input of the control circuit 14 associated with the memory cell 4.

The memory cell 4 comprises a storage capacitor 26, a read transistor 27 and a write transistor 28. The control circuit 14 associated with the memory cell 4 comprises three serially arranged control elements 29, 30 and 31. The output of the control circuit 14 is coupled to the control electrode of the write transistor 28, one electrode of which is coupled to the write line 18 and the other electrode is coupled to an electrode of the storage capacitor 26 and to an electrode of the read transistor 27. The other electrode of the storage capacitor 26 is coupled to reference potential. The second electrode of the read transistor 27 is coupled to the read line 19 and its control electrode is coupled to the junction point of the control elements 29 and 30 of the control circuit 14.

The memory cells 7 and 10 are not provided for delaying the input signal $F_e$ but rather serve only for the purpose of supplying a symmetrical output load to the output of the control circuit 11 and the output of the control element 29. The memory cell 7 comprises a storage capacitor 33, both electrodes of which are coupled to reference potential. Moreover, the memory cell 7 comprises a read transistor 34 and a write transistor 35, one electrode of is which is coupled to reference potential and the other electrode of which is coupled for high resistivity to reference potential. The control electrode of the transistor 34 is coupled to the output of the control circuit 11 and the control electrode of transistor 35 is coupled for high resistivity to reference potential.

Similarly, the memory cell 10 has a storage capacitor 36, both electrodes of which are coupled to reference potential. Moreover, the memory cell 10 comprises a read transistor 37 and a write transistor 38, one electrode of which is coupled to reference potential and the other electrode of which is coupled for high resistivity to reference potential. The control electrode of the transistor 38 is coupled to the output of the control element 29 of the control circuit 14, and the control electrode of transistor 37 is coupled for high resistivity to reference potential. The memory cells 5, 6, 8 and 9 and the memory cells not shown but represented by dots have the same structure as the memory cells 3 and 8 and are connected together. The first control elements of the control circuits 11, 12, 13, 15 and 16 and the control circuits not shown are each controlled by a clock signal PHI 2 and the subsequent second control elements are controlled by a clock signal PHI 1. The control elements 29 and 31 are controlled by the clock signal PHI 1 and the control element 30 is controlled by the clock signal PHI 2. The clock signal PHI 1 and the clock signal PHI 2 are offset with respect to time and do not coincide. The control information of the control signal $F_s$ is transmitted with the positive clock edge of the clock signal controlling the respective control element from the input of each control element to its output.

The operation of the delay circuit will hereinafter be described with reference to a concrete example. The input of the control circuit 13 conveys the periodically repeating bit sequence "1010", and the input signal $F_e$ on the write line 18 is a sine signal of a given frequency. The positive edge of the clock signal PHI 2 controls the control information "1" of the control signal $F_s$ at the output of the control element 43, and the positive edge of the subsequent clock signal PHI 1 controls this information at the output of the control element 44. The instantaneous value of the sine signal on the write line 18 is written by means of the write transistor 42 into the capacitive memory element 40 and simultaneously the value stored in the capacitive memory element 45 is read by means of the read transistor 46 on the read line 19. Simultaneously, the control information "0" is controlled at the input of the control element 43. With the next positive edge of the clock signal PHI 2, the control information "0" is transmitted at the output of the control element 43 and the control information "1" is transmitted at the output of the control element 48, and with the next positive clock edge of the clock signal PHI 1, the control information "0" is transmitted at the output of the control circuit 13 and the control information "1" is transmitted at the output of the control circuit 12. The control electrodes of the transistors 47 and 21 are then controlled, but the control electrodes of the transistors 42 and 46 are not. The instantaneous value of the sine signal on the write line 18 is thereby written into the capacitive memory element 45 by means of the write transistor 47 and simultaneously, the value stored in the capacitive memory element 20 is read on the read line 19 by means of the read transistor 21. Simultaneously, the control information "1" is transmitted at the input of the control circuit 13 and the value stored in the capacitive memory element 40 is read on the read line 19 by means of the read transistor 41.

With the periodically repeating bit sequence "1010" of the control signal, the instantaneous values of the sine signal on the write line 18, which are written into a capacitive memory element by means of a positive clock edge of the clock signal PHI 1, are read again on the read line 19 with the next but one positive clock edge of the clock signal PHI 1. For example, with a periodically repeating bit sequence "100100", the value written into a capacitive memory element with a positive clock edge of the clock signal PHI 1 would be read by means of the subsequent third positive clock edge of the clock signal PHI 1.

When the control information "1" is present at the input of the second control element of a control circuit, it will be transmitted with the positive edge of the clock signal PHI 1 at the output of the control circuit and simultaneously controls the write transistor of the memory cell associated with the control circuit and the read transistor of the subsequent memory cell. This simultaneous control is particularly important in the video technique, because asymmetries in the control would become manifest as picture disturbances. Problems have hitherto particularly occurred when the write and read transistors to be controlled simultaneously are arranged locally remote from each other. For example, if the write transistor 22 and the read transistor 27 which are locally remote from each other were both controlled from the output of the control circuit 11, then the read transistor 27 would be controlled in a delayed manner with respect to the write transistor 22 with a delay time which is dependent on the local remoteness.

The circuit arrangement shown in the FIGURE provides the possibility of simultaneously controlling locally remote write and read transistors without any delay time difference. To this end, the locally remote memory cells 3 and 4 will be further considered. For example, if the control information 1 is present at the input of the control circuit 11, it will be controlled with a positive clock edge of the clock signal PHI 2 at the output of the control element 24. Moreover, this control information is transmitted with a delay time at the input of the control element 29 of the control circuit 14 through the line 50. At the next positive clock edge of the clock signal PHI 1, this control information is then simultaneously transmitted without any delay time difference at the output of the control elements 25 and 29 and the write transistor 22 of the memory cell 3 and the read transistor 27 of the locally remote memory cell 4 are simultaneously controlled without any delay time difference.

The output load of the control circuits 12, 13, 14, 15 and 16 as well as the further control circuits (not shown) are constituted by two memory cells each. For example, the output load of the control circuit 13 is constituted by the memory cells 5 and 6. Asymmetries due to different output loads of the single control circuits lead to picture disturbances, for example, in the video technique. In order that the output load of the control circuit 11 and the output load of the control element 29 of the control circuit 14 are identical to the output load of the other control circuits, the memory cells 7 and 10 are provided. These memory cells are used to supply a symmetrical output load to the outputs of the control circuit 11 and the control element 29 of the control circuit 14. However, they are not used for delaying the input signal $F_e$ and are therefore not coupled to the write line 18 and the read line 19. They may therefore be referred to as "dummy-memory cells".

In a further embodiment of the invention, the input of the control arrangement is coupled to the output of the control arrangement for receiving the output signal. In particular, as shown in the FIGURE, dashed line 52 is shown connecting the output from control circuit 16 to the input of control circuit arranged this way, a loop can be realized with low disturbance. Control information then successively traverses the serially arranged controlled circuits of a number of memory cells, is coupled from the output of the first control circuit and again traverses the serially arranged control circuits. Hence, the first and last memory cells of this loop are realized with low disturbance.

I claim:

1. A delay circuit having a plurality of memory cells each comprising a capacitive memory element, a write transistor for writing information to be delayed from a write line into the capacitive memory element, and a read transistor for reading information from the capacitive memory element to a read line, said delay circuit further having a control arrangement which is clocked by a first control clock, said control arrangement having an input for receiving a control signal, and comprising intercoupled control circuits each associated with a respective memory cell, the read transistor of each respective memory cell being controllable by an input signal of the respective control circuit and the write transistor of each respective memory cell being controllable by an output signal of the respective control circuit, characterized in that each control circuit includes a first control element and a subsequent second control element, in that each control circuit which is arranged locally remote from a preceding control circuit further includes a third control element preceding the first control element, in that an input of the third control element receives an output signal of the first control element of said locally remote preceding control circuit, and in that the first control elements of the control circuits are clocked by the first control clock, and the second and third control elements of the control circuits are clocked by a second control clock.

2. A delay circuit as claimed in claim 1, characterized in that said delay circuit further comprises an additional memory cell, and an output of the second control element of said locally remote preceding control circuits and an output of the third control element of the subsequent locally remote control circuit are coupled to said additional memory cell.

3. A delay circuit as claimed in claim 1, characterized in that said delay circuit further comprises at least one additional memory cell and at least one further additional memory cell, said at least one additional and further additional memory cells not delaying the information, an output of the second control element of each of said locally remote preceding control circuits being coupled to a read transistor of a respective one of said at least one additional memory cells, and an output of the third control element of the subsequent locally remote control circuit being coupled to a write transistor of a respective one of said at least one further additional memory cells.

4. A delay circuit as claimed in claim 1, characterized in that said plurality of memory cells is divided into a first group of memory cells arranged in a first area, and a second group of memory cells arranged in second, locally remote area, and in that the output signal of the first control element of the control circuit associated with the last memory cell of the first group represents the input signal of the control circuit associated with the first memory cell of the second group.

5. A delay circuit as claimed in claim 1, characterized in that the control circuits are serially arranged.

6. A delay circuit as claimed in claim 1, characterized in that the input of the control arrangement receives an external control signal.

7. A delay circuit as claimed in claim 1, characterized in that the input of the control arrangement is coupled to an output of the control arrangement for receiving an output signal of the control arrangement.

8. A delay circuit as claimed in claim 1, characterized in that the input of the control arrangement is coupled to receive an output signal of one of the control circuits.

* * * * *